(12) United States Patent
Sampath et al.

(10) Patent No.: US 6,576,861 B2
(45) Date of Patent: Jun. 10, 2003

(54) METHOD AND APPARATUS FOR FINE FEATURE SPRAY DEPOSITION

(75) Inventors: Sanjay Sampath, Setauket, NY (US); Herbert Herman, Port Jefferson, NY (US); Robert Greenlaw, Huntington Beach, CA (US)

(73) Assignee: The Research Foundation of State University of New York, Stony Brook, NY (US)

( * ) Notice: Subject to any disclaimer, the term of this patent is extended or adjusted under 35 U.S.C. 154(b) by 0 days.

(21) Appl. No.: 09/863,482

(22) Filed: May 23, 2001

(65) Prior Publication Data

US 2002/0012743 A1 Jan. 31, 2002

Related U.S. Application Data

(60) Provisional application No. 60/220,670, filed on Jul. 25, 2000.

(51) Int. Cl.[7] .............................................. B23K 10/00
(52) U.S. Cl. ........................... 219/121.48; 219/121.47; 219/121.5; 219/121.59; 219/76.16; 228/33
(58) Field of Search ....................... 219/121.47, 121.48, 219/121.58, 121.5, 76.15, 76.16; 204/298.07, 298.15; 228/33

(56) References Cited

U.S. PATENT DOCUMENTS

| | | | | |
|---|---|---|---|---|
| 3,684,998 A | * | 8/1972 | Zablocki | 338/174 |
| 3,861,955 A | * | 1/1975 | Lemelson | 117/5.5 |
| 5,301,863 A | * | 4/1994 | Prinz et al. | 228/33 |
| 5,645,884 A | * | 7/1997 | Harlow, Jr. et al. | 427/8 |
| 5,906,757 A | * | 5/1999 | Kong et al. | 219/121.47 |
| 6,250,362 B1 | * | 6/2001 | Rioja et al. | 164/46 |

* cited by examiner

Primary Examiner—Mark Paschall
(74) Attorney, Agent, or Firm—Baker Botts LLP

(57) ABSTRACT

A system for fine feature spray deposition includes a substrate platform for supporting a substrate on which the features are to be deposited. A spray assembly is provided which includes a spray source for providing a stream of material to be deposited on a substrate, a collimator which is positioned in a path of the stream from said spray source and an aperture assembly, which is positioned downstream of the collimator with respect to the spray source and above the substrate platform. The aperture assembly defines at least one opening to pass a portion of the stream of material onto a surface of the substrate. A drive mechanism is provided which is coupled to at least one of the spray assembly and the substrate platform for inducing relative motion there between. A controller is coupled to the spray assembly and the drive mechanism to control the relative motion and the stream of material. The system allows fine features to be printed directly on a substrate with requiring a predefined mask. Multilayer structures, such as electrical components for circuits or sensor systems, can be formed by sequentially depositing features with various electrical properties.

45 Claims, 8 Drawing Sheets

METHOD AND APPARATUS FOR FINE FEATURE SPRAY DEPOSITION

This application claims the benefit of U.S. Provisional patent application entitled APPARATUS AND METHOD FOR DEPOSITING FINE FEATURES OF A MATERIAL PROVIDED IN A SPRAY, Ser. No. 60/220,670, and filed on Jul. 25, 2000.

FIELD OF THE INVENTION

The present invention relates generally to spray deposition, such as thermal spray deposition, and more particularly relates to systems and methods for producing fine line features using spray deposition.

BACKGROUND OF THE INVENTION

It is generally known that thermal spray deposition is an effective technique for the fabrication of multi-layer devices which have various layers with a variety of physical characteristics and properties. An advantage of thermal spray deposition is that it is generally a one-step process which combines melting, quenching and consolidation into a single operation.

As described in U.S. Pat. No. 5,301,863 to Prinz, using spray deposition techniques in conjunction with a predefined mask, multilayer articles can be fabricated on a substrate. However, the typical plume from a thermal spray torch results in over spray and high temperature impingement on the mask. Also, since the mask is mounted on the substrate, there are limits on the geometry of the underlying substrate on which such circuits can accurately be fabricated. In addition, the mask and any unwanted deposit material must be removed from the surface of the substrate prior to fabricating subsequent layers. This requires additional fabrication steps and equipment.

It would be desirable to provide a system for fine line spray deposition of materials, such as conductors and insulators, which does not require a predefined mask and which offers reduced exposure to the high temperature plume of a spray torch.

SUMMARY OF THE INVENTION

It is an object of the present invention to provide a system for fine line spray deposition.

It is a further object of the present invention to provide an apparatus for fine line spray deposition which reduces thermal impingement on the surface of the substrate.

It is another object of the present invention to provide a method for producing multilayer structures, such as electronic circuits, using a thermal spray deposition process without requiring a mask in contact with the substrate.

A method for depositing a fine feature on a substrate using spray deposition in accordance with the invention includes generating a stream of material from a spray source, passing a portion of the stream through a collimator spaced from the spray source, passing the portion of the stream through an opening in an aperture member spaced from the collimator and supported above the surface of the substrate, and moving one of the substrate or aperture member to define the feature on the surface of the substrate.

Preferably, the aperture member is dynamic and the method also includes the step of adjusting the opening in the aperture member in accordance with a feature to be generated. For example, the aperture member can include a number of intersecting members which define an opening over the substrate where the size of the opening can be altered by changing the relative position of the members. Alternatively, an aperture member cutting station can be provided to generate the desired aperture opening prior to advancing the opening over the surface of the substrate.

By repeating the process with materials having various electrical properties, such as conductive, resistive, dielectric and insulative materials, multilayer electronic components and sensor systems can be directly printed on the surface of a substrate.

A system for fine feature spray deposition in accordance with the present invention includes a substrate platform for supporting a substrate on which the features are to be deposited. A spray assembly is provided which includes a spray source for providing a stream of material to be deposited on a substrate, a collimator which is positioned in a path of the stream from said spray source and an aperture assembly, which is positioned downstream of the collimator with respect to the spray source and above the substrate platform. The aperture assembly defines at least one opening to pass at least a portion of the stream of material onto a surface of the substrate. A drive mechanism is provided which is coupled to at least one of the spray assembly and the substrate platform for inducing relative motion there between. A controller is coupled to the spray assembly and the drive mechanism to control the relative motion and the stream of material.

In certain embodiments, the spray assembly can be fabricated without the use of a collimator, with a simplified collimator design or by replacing the collimator with an additional apperture spaced apart from the first aperture.

In one embodiment, the collimator is formed with a first wall section and a second wall section which converge in a V-shaped arrangement and define an opening at an apex of the V-shaped arrangement.

The collimator can include first and second collimator members in a spaced relationship with respect to one another. For example, the first collimator member can be formed with a first wall section and a second wall section converging in a V-shaped arrangement and defining an opening at an apex of the V-shaped arrangement and the second collimator member can be formed as a frustoconical member having an opening in substantial alignment with at least a portion of the opening in the first collimator member.

The aperture assembly can be formed with a supply reel, an elongate strip of flexible aperture material having at least one opening defined therein and engaged on the supply reel, and a take-up reel for receiving the aperture material. The supply reel and take-up reel are positioned to extend at least a portion of the aperture material over the substrate platform. A rotational drive assembly is operatively coupled to at least one of the supply reel and the take-up reel to advance the aperture material with respect to the substrate platform. The aperture material can be formed with a number of openings arranged in repeating patterns along the length of the aperture material.

In another embodiment, the aperture assembly includes a supply reel having a first supply reel portion and a second supply reel portion which are axially aligned and axially displaceable. A first elongate strip of flexible aperture material is engaged on the first supply reel portion and a second elongate strip of flexible aperture material is engaged on the second supply reel portion. A take-up reel is provided for receiving the aperture material. The take-up reel has a first take-up reel portion and a second take-up reel portion which are mutually axially aligned and axially displaceable. The supply reel and take-up reel are positioned to extend at least a portion of the first elongate strip of flexible aperture material and the second elongate strip of flexible aperture material over the substrate platform in a substantially parallel relationship to define an opening therebetween. A rotational drive assembly is coupled to at least one of the supply reel and the take-up reel to advance the aperture material with respect to the substrate platform. A displacement drive assembly is operatively coupled to the supply reel and the take-up reel to control a spacing between the first elongate strip of flexible aperture material and the second elongate strip of flexible aperture material.

Preferably, the aperture assembly includes a first aperture sub-assembly and a second aperture sub-assembly, each formed substantially as described above, and being substantially orthogonally aligned over the substrate platform.

The drive mechanism of the system can take on several forms. For example, the drive mechanism can be an x-y drive table coupled to the substrate platform, spray assembly or both. Alternatively, the drive mechanism can include a robotic arm operable in the x, y and z directions which is coupled to the spray assembly, substrate platform or both.

The spray source can take the form of a combustion spray torch, a plasma spray torch, a detonation gun, high velocity oxygen fuel (HVOF) spray gun, arc spray, a cold spray gun and the like.

To enhance the rapid prototyping capability of the system, a CAD interface can be operatively coupled to the controller to translate drawing files from a computer aided design system to instructions for the CPU to control the spray assembly and drive mechanism.

In yet another embodiment, the aperture assembly can include an aperture cutting device, such as a laser, which is operatively coupled to the controller for forming the opening in the aperture assembly.

BRIEF DESCRIPTION OF THE DRAWING

Further objects, features and advantages of the invention will become apparent from the following detailed description taken in conjunction with the accompanying figures showing illustrative embodiments of the invention, in which:

FIG. 9 is a perspective view of an alternate embodiment of a dynamic aperture sub-assembly employing parallel plates with adjustable spacing there between.

Figure 1:
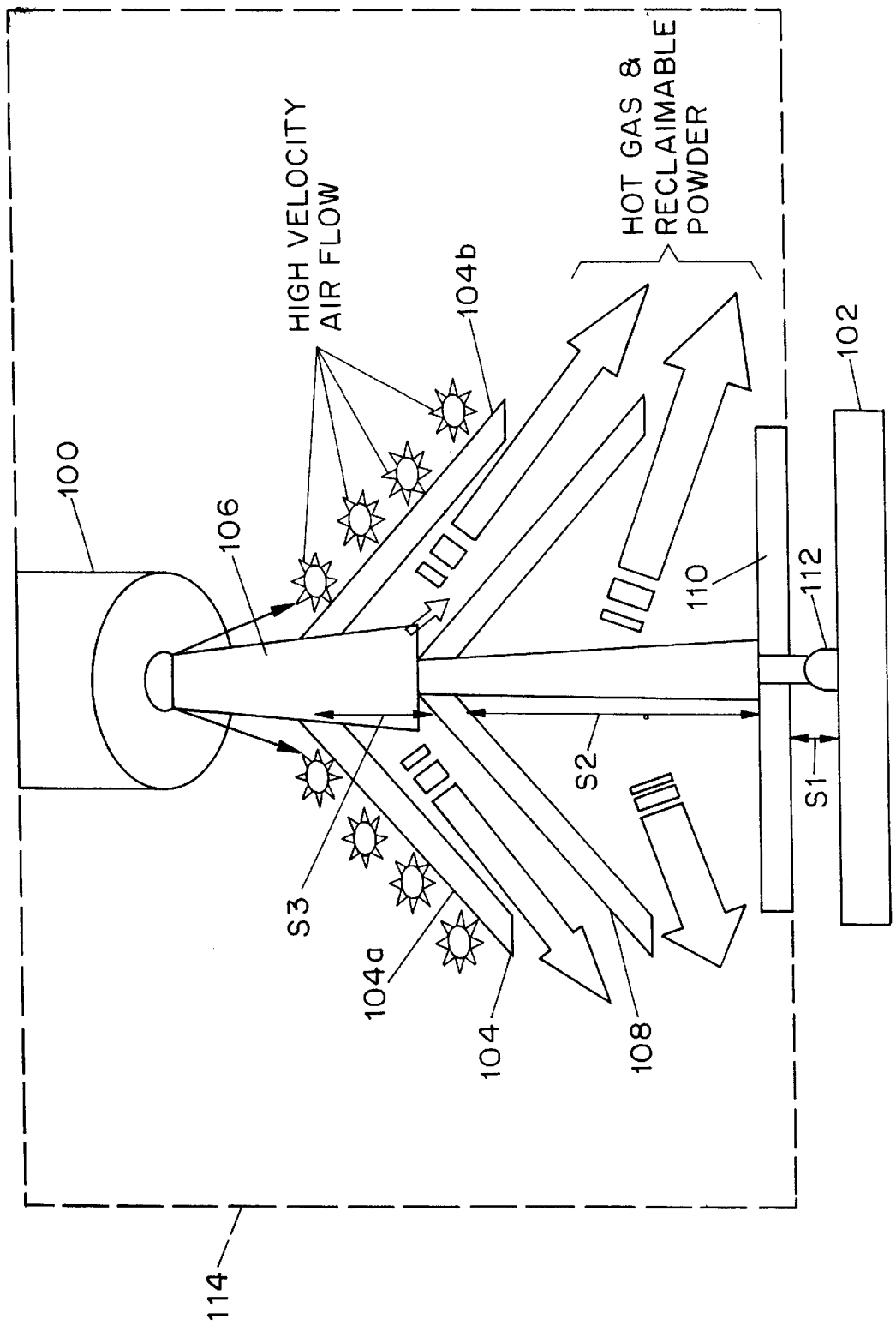
FIG. 1 is a simplified cross sectional diagram illustrating the relationship between the spray source, collimator, aperture and substrate, which are used to generate fine features using spray deposition.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

FIG. 1 is a simplified cross sectional diagram of the present system for generating fine features on a substrate using spray deposition. The system includes a spray source 100, such as a thermal spray torch, which generates a plume including a spray stream of a material to be deposited on a substrate 102. The plume and spray stream is directed onto a collimator 104 which passes a portion of the spray stream through an opening 106 towards the substrate 102 and directs the remainder of the spray plume away from the substrate.

The spray plume from a typical thermal spray torch generally exhibits a Gaussian distribution of material in the spray stream. Therefore, if only the scale of the torch is reduced, the resulting deposit will still generally exhibit such a Gaussian distribution in its thickness, which can effect performance in such objects as antenna and microwave circuit components. Therefore, in many cases, collimator 104 is used to reduce the diameter of the spray plume. The collimator 104 only passes a central portion of the spray plume, where the distribution of material is substantially uniform, such that the resulting deposit will have a substantially uniform thickness. The collimator 104 reduces both the scale of the effluent plume from the torch 100 and also significantly reduces the heat from the plume which impinges on the substrate 102. Thus it is generally preferred to use the collimator 104. However, certain spray techniques, such as cold spray techniques, may be practiced in accordance with the present invention without the use of a collimator or with the use of a simplified collimator design.

The opening 106 in the collimator is preferably contoured to minimize the amount of turbulence which is induced in the spray stream passing therethrough. In one embodiment, the opening 106 is defined by a linear taper which is about 1 mm at the top, or entrance, of the opening 106 and expands to 2 mm at the bottom, or exit of opening 106. Optionally, the collimator 104 can include a second collimator member 108 to further reduce the plume size and heat impingement on the substrate 102.

The collimator 104, 108 is spaced by a distance S2 from an aperture member 110 which in turn is spaced from the surface of the substrate 102 by a distance of S1. Depending on the surface contour of the substrate 102 and the characteristics of the features being deposited, the spacing S1 of the aperture member 110 from the substrate surface can be in the range of 0.1 mm to 10 mm. The spacing, S2; between the collimator 104, 108 and the aperture member 110 and the spacing S3 between collimator members 104, 108 is largely dependant on the geometry of the collimator and the thermal characteristics of the torch, aperture and substrate. As S2 is increased, the degree of thermal impingement is reduced, however, the portion of the spray stream that is passed through the opening 106 will tend to become more divergent, thus reducing the precision of the resulting feature. The aperture member 110 defines an opening through which the material to be deposited passes. Generally, this opening is adjustable and can provide for the deposit of very fine features, such as line widths of about 20 microns, as well as larger area deposits, such as large patches of material with precise geometries.

The use of the collimator 104 in combination with the aperture 110 allows the material in the spray plume to be deposited on the substrate 102 with relatively sharp contours in the deposit 112, such as line widths on the order of 20–200 microns, and minimal heat transfer to the substrate 102. Further, as the aperture 110 does not contact the substrate 102, the substrate need not be planar. This allows for deposits on substrates of complex geometries without requiring a conformal mask being deposited on the surface of the substrate. In addition, the significant reduction in heat from the spray plume which impinges the aperture member 110 allows the aperture member 110 to be formed from lower temperature materials, such as plastics.

The torch 100, collimator 104, 108, and aperture member 110 are generally formed as a sub-assembly with a common chassis (not shown) and may be referred to herein as the spray assembly 114.

The spray source 100 is generally a thermal plasma spray torch, but can take the form of any spray source known to those skilled in the art of spray deposition.

For example, various embodiments of combustion spray torches, plasma spray torches, arc spray torches, cold spray technology and detonation gun technology can be used in the practice of the present invention.

Figure 2:
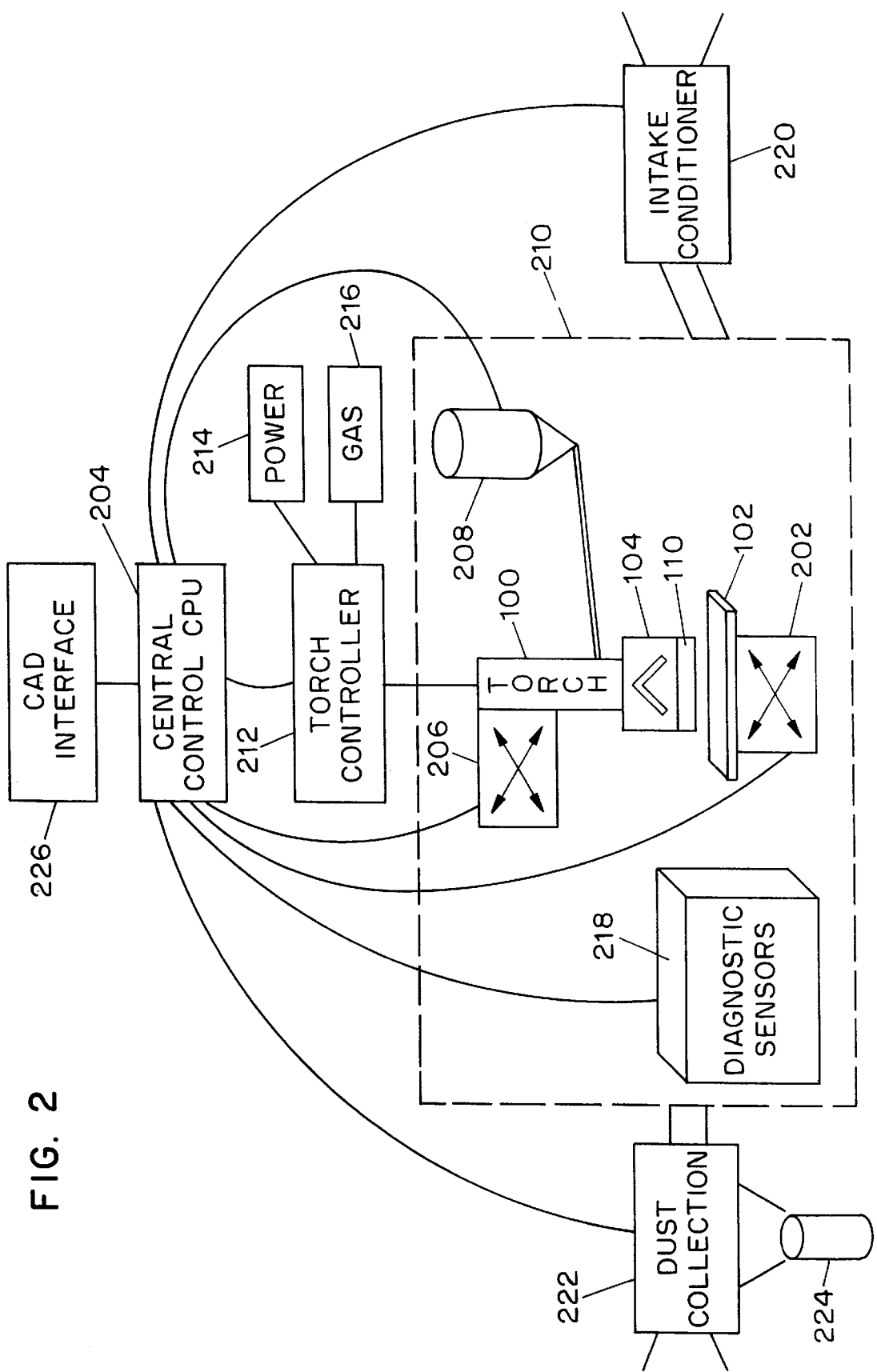
FIG. 2 is a simplified block diagram illustrating the primary operative components in one embodiment of the present fine feature spray deposition system.
Figure 3:
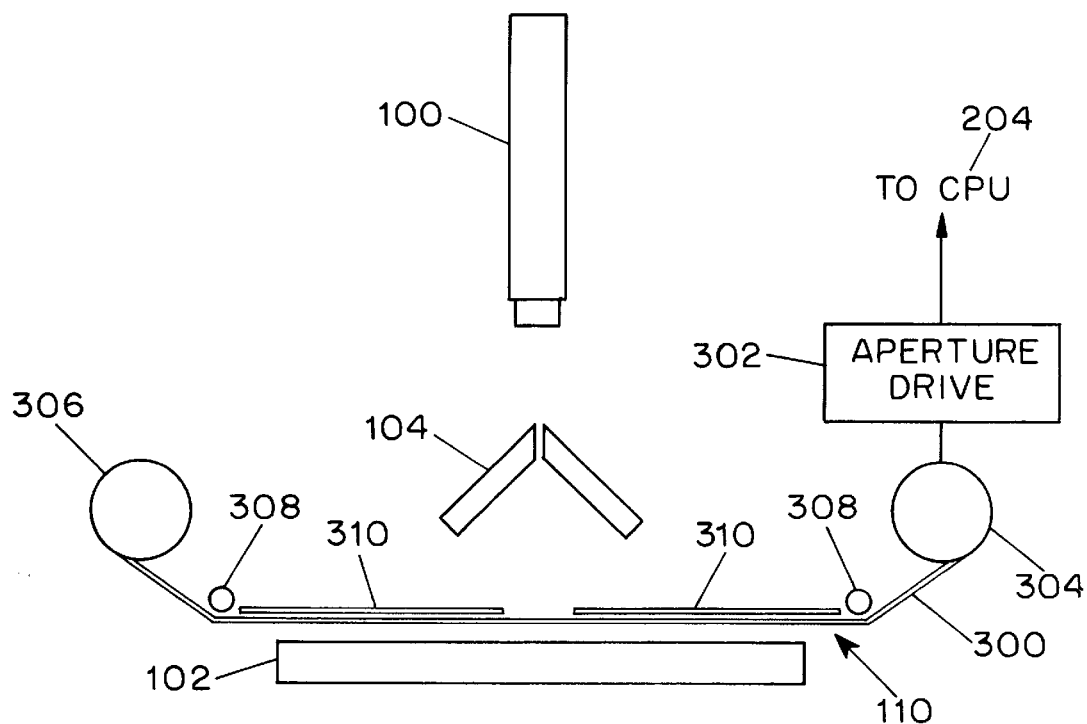
FIG. 3 is a simplified pictorial cross section of an embodiment of the fine feature spray deposition system employing a continuous feed aperture.
Figure 4:
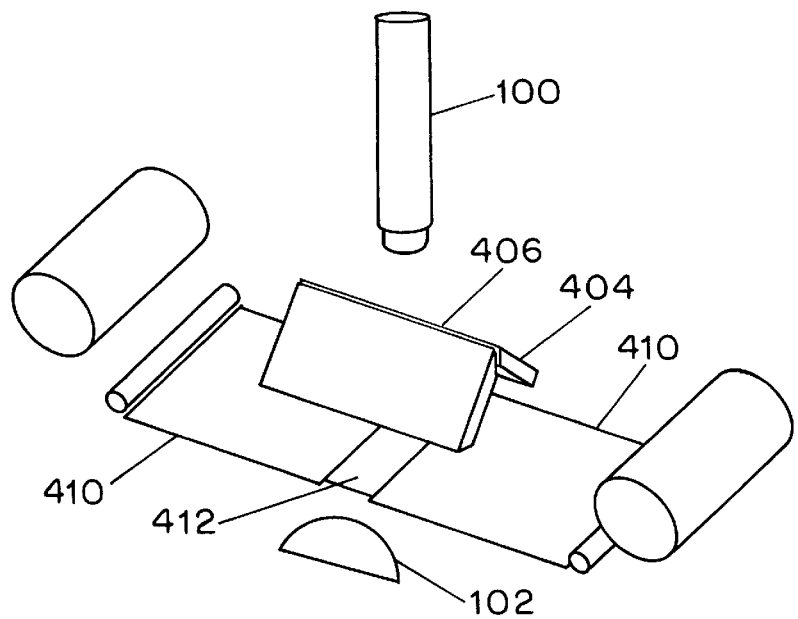
FIG. 4 is a perspective view of an exemplary arrangement of a collimator and aperture sub-assembly.
Figure 5A:
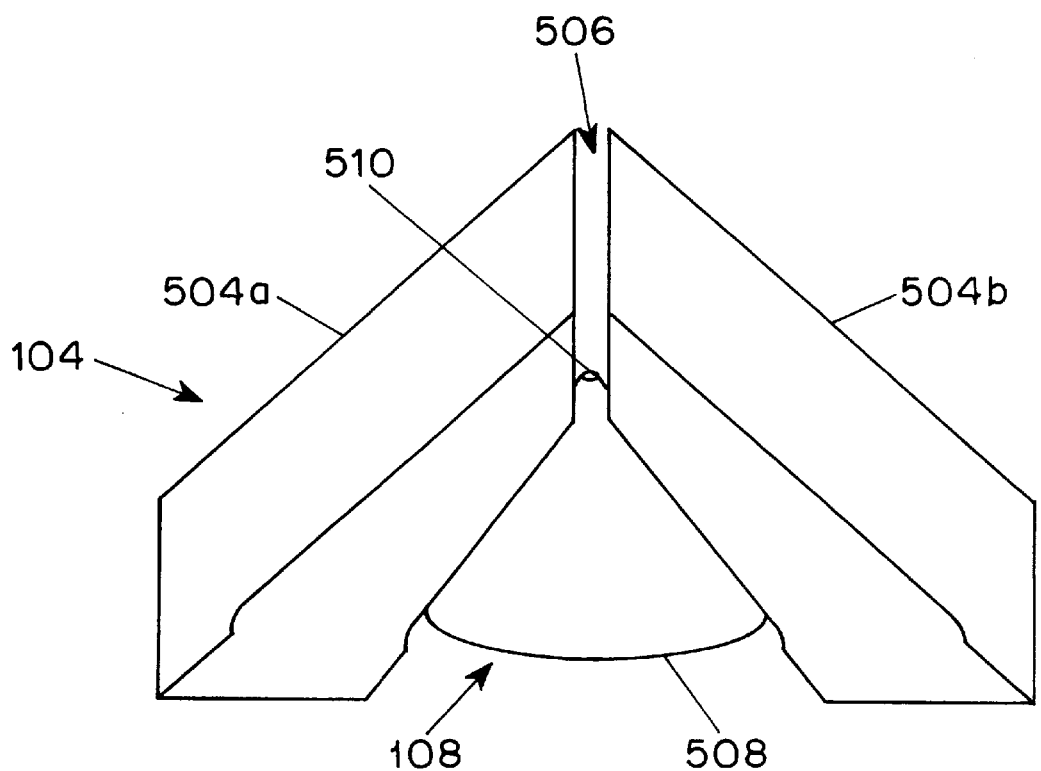
FIG. 5A is a perspective view of an exemplary arrangement of a collimator.
Figure 5B:
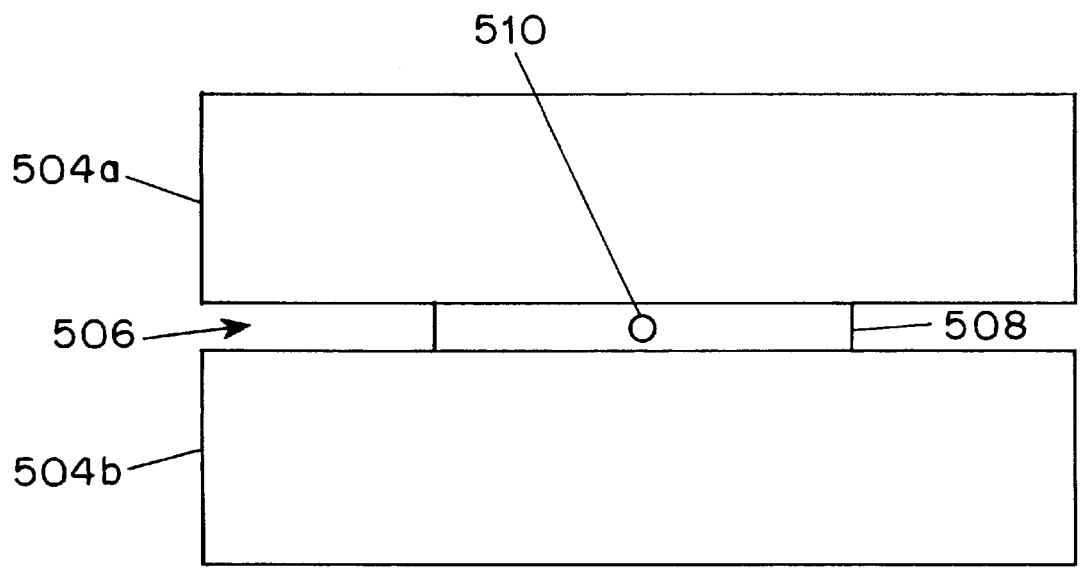
FIG. 5B is a bottom view of the collimator of FIG. 5A.

FIG. 2 is a block diagram further illustrating the primary operative components of the present fine feature spray system. In addition to the components of the spray system which were introduced in FIG. 1, the present system will generally include a mechanical drive system for inducing relative motion between the substrate 102 and the portion of the spray stream passing through aperture member 110. Such relative motion can be induced in a number of ways. For example, the substrate is generally mounted on a substrate platform which can be placed on an X-Y drive table 202 which can effect movement of the substrate 102 in response to a control signal from a central control CPU 204. In addition to, or in the alternative, the position of the spray assembly 114 including the torch 100, aperture 106 and collimator 104 can be moved either by mounting this assembly on a drive mechanism 206, such as an X-Y drive table or a multi-axis robotic system which provides X-Y-Z axis motion and preferably, angular positioning of the assembly under the control of CPU 204. The ability for multi-axis and angular movement of the spray assembly with respect to the substrate can facilitate the deposition of material on non-planar substrates.

The torch 100 is coupled to a feedstock delivery system 208 which is selected based on the material to be deposited. Generally, the feedstock takes the form of a powder or wire stock which are fed to the torch 100 by the feedstock delivery system 208 at a controlled rate which is directed and monitored by CPU 204. While these forms of feedstock are most common, the present system is not so limited and feedstock in the form of liquids, suspensions, slurries, aerosols and the like can also be used where appropriate and desired. The composition of the feed stock material will depend on the electro-mechanical requirements of the deposit. The feedstock material can be conductive, such as metals, resistive, such as resistive oxides or metal ceramic composites, dielectric or insulative, such as various ceramics and polymers. In forming a multilayer structure, it is typical for various deposit materials to be used, such as alternating layers of conductive material, resistive material and insulative material to form multilayer electronic circuits. In this case, a system for forming such a component can include a spray assembly 114 and associated drive assembly and feedstock delivery system 208 for each material being used.

Figure 10:
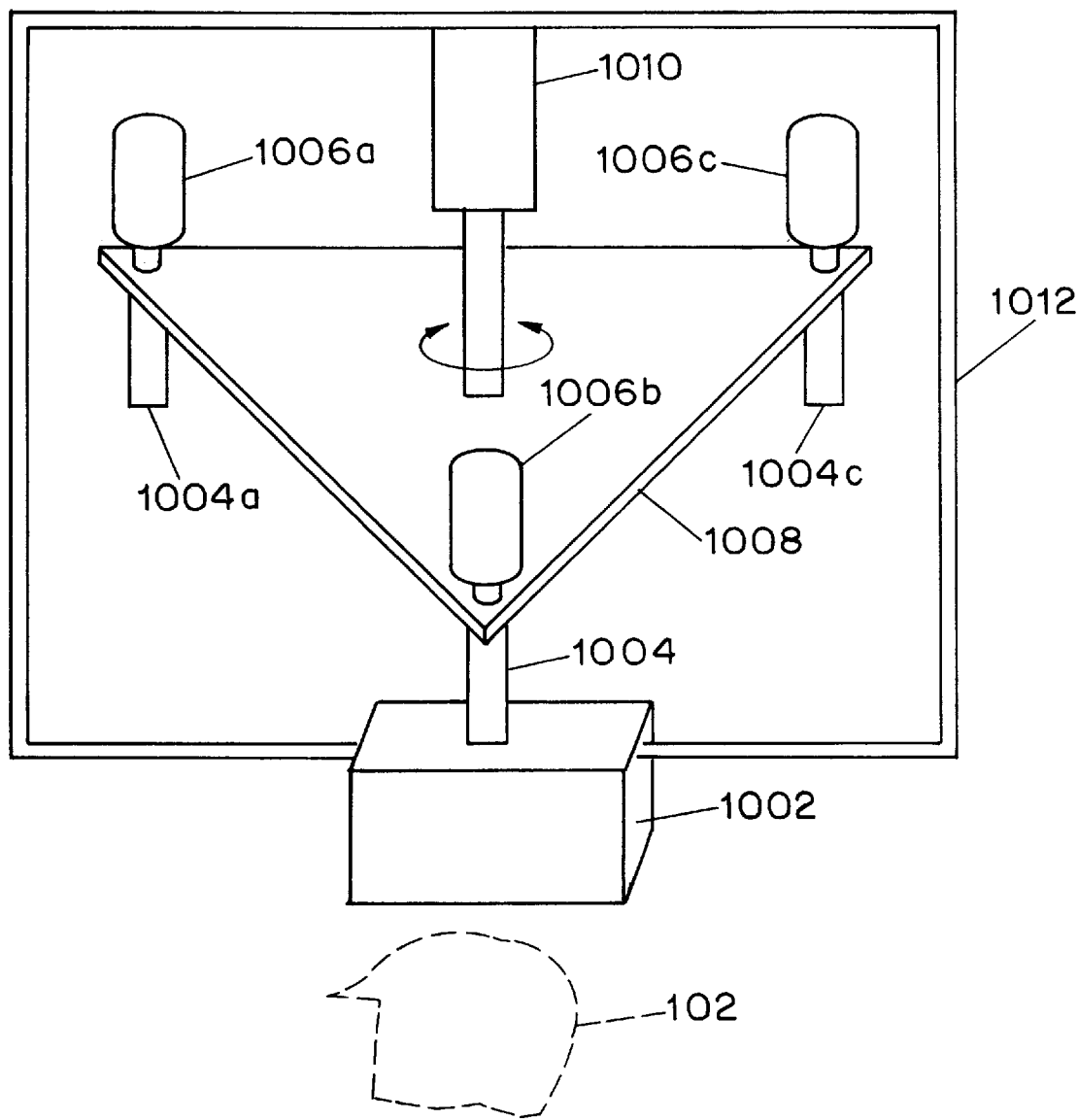
FIG. 10 is a perspective view of an alternate embodiment of a spray assembly which includes a number of torch assemblies associated with a single collimator/aperture assembly.

An alternative multi-material system embodiment is illustrated in FIG. 10. A common collimator/aperture assembly 1002 is used in conjunction with a number of torches 1004a, 1004b, 1004c and associated feedstock delivery assemblies 1006a, 1006b, 1006c. The torches 1004 and feedstock delivery assemblies 1006 can be mounted on a common turret plate 1008 which is rotationally driven by a drive assembly 1010 to place one of the torches 1004a, 1004b, 1004c into alignment with the collimator/aperture assembly 1002. The drive assembly 1010 and collimator/aperture assembly 1002 can be mounted to a common chassis 1012 which in turn can be coupled to an associated drive assembly (not shown), such as a conventional robotic arm with six degrees of freedom. The internal construction of the collimator/aperture assembly 1002 can take on any of the forms illustrated herein and variants thereof.

Returning to FIG. 2, to protect the operators and surrounding environment as well as to facilitate feedstock recovery, it is preferable for the spraying components to be mounted within an enclosure 210. Because the interior of the enclosure 210 will generally be a hostile environment with elevated temperatures and feedstock dust being abundant, it is preferable for the CPU 204 and associated control electronics to be mounted outside of the enclosure 210 with suitable electrical feedthrough connections being provided to allow control and feedback signals to be provided.

The spray source 100 can be controlled by the CPU 204 or by a separate torch controller 212 interposed between the torch 100 and the CPU 204. The torch controller generally controls the amount of power 214 and gas 216 provided to the torch to control the temperature, material volume and velocity of the effluent plume from the torch 100 in a conventional manner.

Diagnostic sensors 218 can be provided within the enclosure 210 to monitor various parameters of the deposition operation. For example, laser based positioning sensors can be used to determine the position of the substrate and the thickness of the deposit. In addition, temperature sensors can be provided to determine the temperature of the ambient environment within the enclosure and the temperature of the substrate. Further, spray plume sensors can be used to measure the width, particle temperature and particle velocity of the plume.

Airflow through the enclosure 210 can be controlled by an air intake conditioner 220 and dust collection exhaust assembly 222. The air intake conditioner 220 and the dust collection exhaust assembly 222 can be operated under the control of CPU 204. As illustrated in FIG. 1, the impingement of the plume onto the collimator 104, 108 and aperture 110 results in a redirection of a portion of the material in the plume away from the substrate and into the environment of the enclosure 210. The dust collection exhaust assembly 222 is in communication with the environment of the enclosure 210, passes the air through a filter prior to discharge into the ambient atmosphere and captures feedstock material from the filter for collection in a reclaimed feedstock container 224.

Preferably, the CPU 204 includes, or is operatively coupled to, a CAD interface 226. The CAD interface 226 converts drawings which are prepared in a conventional computer aided design (CAD) program into control instructions to determine the sequence of movements of the spray assembly 114 and substrate 102 during a deposition process. Alternatively, the control instructions can be entered by other input devices, such as by manually entering control sequences via a keyboard (not shown) coupled to the CPU 204.

As set forth above, the collimator 104 is intended to limit the gas plume and to direct a substantial amount of heat from the spray torch 100 away from the substrate 102. In order to achieve these functions, various embodiments of collimator 104 can be provided. As illustrated in FIGS. 1, 3, 4, 5A and 5B, the collimator can be a single assembly or can be multiple pieces, such as collimator members 106, 108. Referring to FIG. 1, one embodiment of the collimator 104 is formed with two or more side wall sections 104a, 104b, which are contoured to direct a portion of the spray plume away from the substrate 102. The contour of the sidewalls can be determined empirically or by mathematical models based on fluid dynamics in order to reduce turbulence as the high velocity air flow from the spray plume is directed over the collimator. The side wall sections generally converge in a substantially inverted V-shaped arrangement with respect to the spray source 100 and form an apex which includes an apex opening 106 through which the central portion of the spray stream passes.

The size, shape and contour of the apex opening 106 can be modified to achieve different spray characteristics. In one embodiment, the collimator is formed with substantially planar side wall sections 104a, 104b which converge at an angle of about 45 degrees and define an apex opening which is a slot having a width of 1–2 millimeters (mm). As illustrated in FIG. 1, a second collimator member 108, can be formed with side wall sections 108a, 108b which are substantially parallel to the first collimator member 104 and define a smaller slot, such as 0.5–1 mm.

The collimator 104 embodiment of FIG. 1 only trims the plume and particle stream in one dimension, i.e. either the X or Y linear dimension. The collimator can be formed from a number of materials, such as steel, AlN, $Si_3N_4$, glass and ceramic, which are preferably selected to be resistant to the high temperature spray plume. Preferably, the collimator is provided with a highly polished surface to minimize sticking of material being deposited. Surface treatments, such as organic layers, can be applied to the surface to minimize sticking as well.

A collimator cooling system can be provided to circulate a coolant, such as air or water, over the collimator to assist in heat removal. In addition, the surface of the collimator 104 which is exposed to the spray stream can be treated with a non-stick surface, such as Teflon, to reduce the amount of buildup of feedstock material on the collimator during a spray deposition process. Material buildup on the surface of the collimator can also be reduced by super cooling the collimator, such as by the use of liquid Nitrogen, Carbon Dioxide and the like. In order to eliminate build up of material on the collimator 104 and occlusion of the apex opening 106, a collimator cleaning system can be employed. This can be accomplished, for example, by passing a wire or cleaning blade over the surface of the collimator, using an air knife or using a blast cleaning system which directs a stream of blast media, such as glass, CO2, water and the like onto the surface of the collimator.

FIG. 4 is a perspective view which illustrates an exemplary arrangement of a one dimensional collimator and aperture assembly 410. In this arrangement, the opening 406 is a slot which is orthogonal to a slot shaped opening 412 in the aperture member 410. The collimator 404 trims the plume and spray stream in a first direction and passes a line-shaped portion of the spray stream onto the aperture member which trims the spray stream in the orthogonal direction to form a relatively small rectangular stream of material being deposited on a substrate 102.

FIGS. 5A and 5B illustrate an alternate embodiment of a collimator 104 which is suitable for reducing the spray plume in two dimensions. Referring to FIG. 5A, the exemplary collimator embodiment includes a first collimator member formed with sidewall sections 504*a*, 504*b* which define an apex opening 506, much in a manner as described above. The collimator embodiment also includes a second collimator member which is formed as a frustoconical section 508 defining a circular apex opening 510. The first collimator member 104 directs a substantial portion of the gas plume along sidewall sections 504*a*, 504*b* and away from the substrate 102. The portion of the spray stream which passes through the apex opening 506 is directed onto the second collimator member 108. A small portion of the spray stream is then passed through the circular apex opening 510 to the aperture 110 while the remainder of the plume is directed in a channel defined by a spacing S3 between the first and second collimator members away from the substrate 102. In this way, the spray stream is reduced in two dimensions and the substrate is protected from the spray plume by the two collimator members.

As illustrated in FIG. 1, once the spray plume and spray stream from the torch 100 have been collimated, the remaining central portion of the spray stream is directed onto the surface of an aperture member 110 which is supported above the surface of substrate 102. The aperture member is preferably dynamic in that the size and or shape of the aperture can be altered during a deposition process. Several embodiments of aperture member 110 can be used to achieve this objective. Referring to FIG. 3, the aperture member 110 can take the form of a substantially continuous roll of aperture material 300 which can be advanced over the surface of the substrate by an aperture drive system 302 under the control of the CPU 204. In this embodiment, there is generally a supply spool 304 which contains unused aperture material, a take-up spool 306 for receiving the aperture material as it is used and a number of guide rollers 308. The aperture material 300 is generally planar and flexible and has a width which is selected to extend over the width of the substrate 102. One or more aperture material support members 310 such as plates, tracks, rails, rollers and the like may be arranged along the extent of the aperture material 300 to support the flexible material during the spray deposition process.

Referring the FIG. 6A and FIG. 6B, the aperture material 300 can have various predetermined perforation patterns therein to allow deposit material to pass there through. For example, as shown in FIG. 6A, the aperture material can be formed with a pattern of slot shaped apertures having a plurality of widths, such as slots 602, 604, 606, 608. This pattern can be repeated over the length of the aperture material. The size, shape and number of apertures in the pattern can vary based on the structure being formed. In some applications, where the expected line width is constant, the slots can be a constant width. To write a feature of a certain width on the substrate, the CPU 204 directs the aperture drive 302 to advance the aperture material 300 over the substrate to place the appropriate width aperture in the path of the spray stream. After a predetermined deposition period, after which it is expected that deposit buildup on the aperture material 300 will adversely effect the precision of the aperture, the CPU 204 can direct the aperture drive 302 to advance the aperture material to the next pattern of apertures which include the appropriate aperture opening. To quickly stop the deposit of material on the substrate, the aperture material can be advanced to a portion which does not include an opening, such that the spray stream is completely blocked. Alternatively, a separate shutter assembly can be interposed within the path of the stream.

Figure 6A:
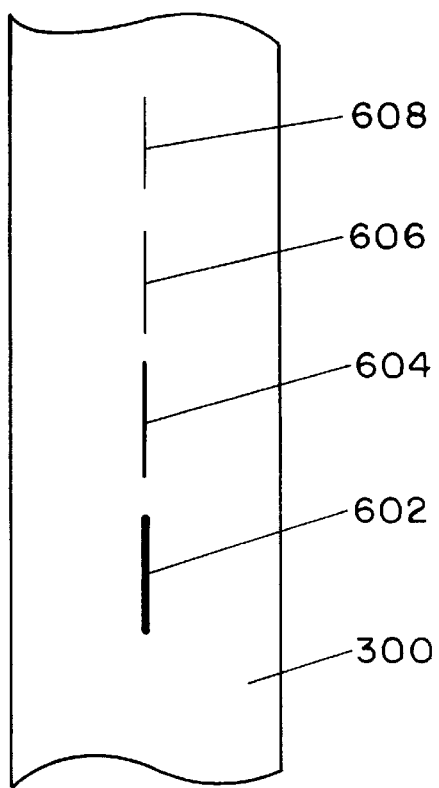
FIG. 6A and FIG. 6B illustrate alternate exemplary embodiments of continuos feed aperture material for use in the present fine feature spray deposition system.
Figure 6B:
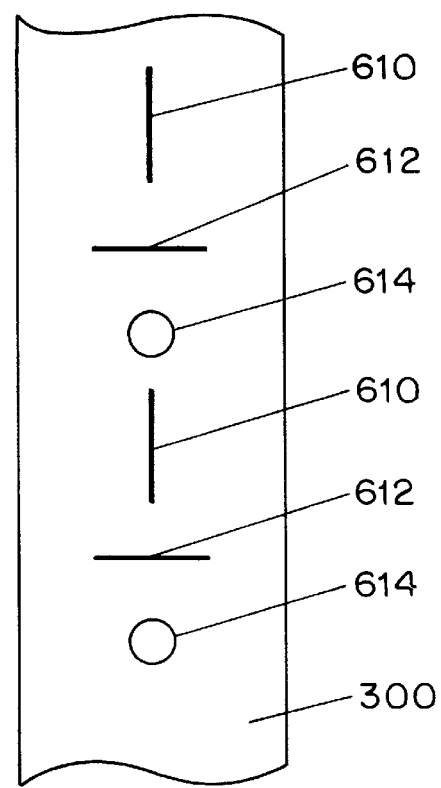

As illustrated in FIG. 6B, the apertures formed in the aperture material 300 can take on various geometries and orientations as well as widths. In FIG. 6B an aperture pattern is provided with includes a first slot 610, a second slot 612 which is orthogonal to the first slot, and a circular aperture 614. As in FIG. 6A, this pattern can be repeated along the length of the aperture material and the appropriate aperture selected by CPU 204. The patterns illustrated in FIGS. 6A and 6B are merely illustrative. Any number of aperture sizes, shapes and geometries can be used to suit a desired fabrication process. For example, a repeating pattern of circular apertures of constant or varying diameter may be used.

Figure 7:
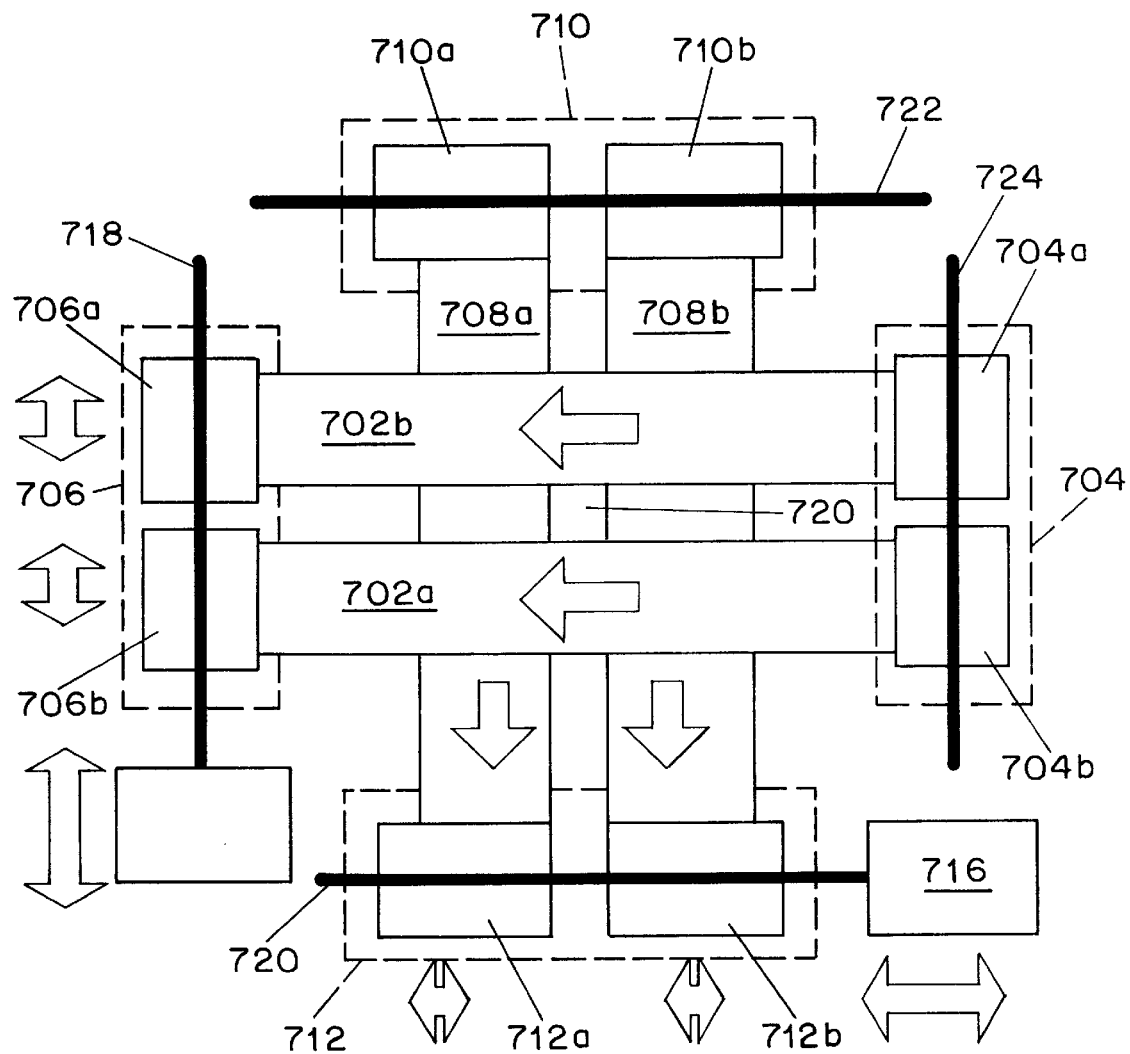
FIG. 7 is an embodiment to a dynamic aperture sub-assembly which employs two orthogonally aligned aperture members to define generalized features.

FIG. 7 illustrates a further embodiment of an aperture member sub-assembly which provides continuous and dynamic aperture generation. This embodiment includes a first continuous aperture member 702 with associated supply reel 704 and take-up reel 706 which are driven by an aperture drive 716 substantially as described in connection with FIG. 3. The continuous aperture also includes a second continuous aperture member 708 with associated supply reel 710 and take-up reel 712 which are driven by a rotational aperture drive 716 also formed in a manner substantially as described in connection with FIG. 3. The first and second aperture members are formed with a substantially continuous slot therein and are aligned in a substantially orthogonal relationship. This results in a rectangular aperture opening which can be continuously maintained during a spray deposition process.

In addition to having a rotational aperture drive for each aperture member 702, 708, each aperture member can also be provided with a displacement drive mechanism 714, 716 for moving the aperture member along an axis 718, 720 substantially parallel to the width of the respective aperture member. Under the control of CPU 204, the resulting aperture 720 can be moved with respect to the substrate by altering the relative displacements of the aperture members 702, 708. For example, a line can be printed on a substrate 102 with the substrate held in a fixed position by altering the displacement of aperture member 708 along the X-axis while maintaining the position of aperture member 702. If both aperture member 702 and aperture member 708 are simultaneously displaced, curves, angles, tapered lines and other generalized features can be printed on the substrate 102.

Each aperture member 702, 708 can be formed as two parallel aperture member halves 702a, 702b and 708a, 708b, respectively. In this case, the supply reels 704, 712 will take the form of parallel supply reel assemblies 704a, 704b and 712a, 712b, respectively. Similarly, take-up reels 706, 710 will also be formed as two parallel supply reel assemblies 710a, 710b and 706a, 706b respectively. In addition to the rotational drives and displacement drives described above, each aperture member can also include a spacing drive assembly which alters the relative displacement of the aperture member halves 702a, 702b and 708a, 708b along axes 718, 720, respectively. In this configuration, the size and geometry (e.g., square or rectangular) of the aperture orifice can be dynamically adjusted.

Figure 8:
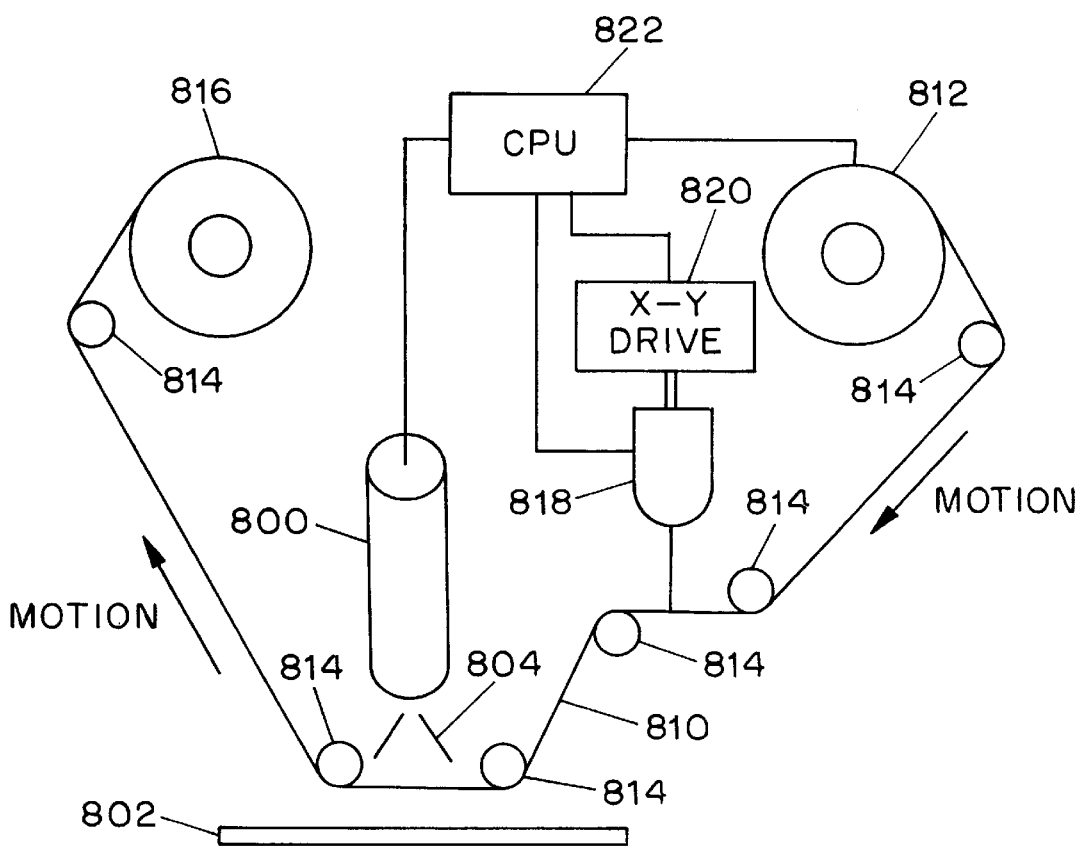
FIG. 8 is a simplified diagram illustrating an embodiment of the system which uses an aperture cutting operation to dynamically generate the aperture used in the present fine feature spray deposition system.

FIG. 8 illustrates an alternate embodiment of a fine feature deposition system which includes a dynamic aperture generation feature. The system includes a spray torch 800, collimator 804 and aperture material 810 which cooperate to deposit a fine feature of a material onto a substrate 802. The aperture material 810 is provided as a substantially continuous sheet of material which is stored on a supply roll 812 and is passed through a number of material guides 814, such as guide spools 814, to a pick up roll 816. The aperture material on supply role 812 is a flexible planar material which is preferably a plastic film material, but also can take the form of metal foils and the like. The system further includes a cutting tool 818 which is mounted on a drive unit, such as an X-Y drive mechanism 820, both of which operate under the control of CPU 822 to dynamically generate an aperture in the aperture material 810. In one embodiment, the cutting tool drive mechanism 820 can provide movement in a single axis which is substantially perpendicular to the direction of feed of the aperture material. Preferably, the cutting tool 818 takes the form of a laser, but mechanical and electrical arc discharge cutting devices may be suitable for certain aperture materials. When the cutting tool 818 takes the form of a laser, the aperture size can be altered by changing the focus and/or focal distance of the laser. As in FIG. 2, it is preferred that the CPU 822 control the motion of the aperture material, spray assembly and substrate 802. It is also desirable for the CPU 822 to be provided with a CAD interface to facilitate the rapid translation of computer design drawings to finished products.

The embodiments of FIGS. 7 and 8 can be effectively combined to create a highly flexible, dynamic aperture system. In such an embodiment, two aperture drive and cutting systems, essentially as shown and described in connection with FIG. 8, are arranged to overlap over the substrate 802, in a manner described in connection with FIG. 7. By continuously cutting a line in each aperture material of a desired width, the resulting aperture is a rectangle of variable aspect ratio which is continuously movable with respect to the substrate.

Figure 9:
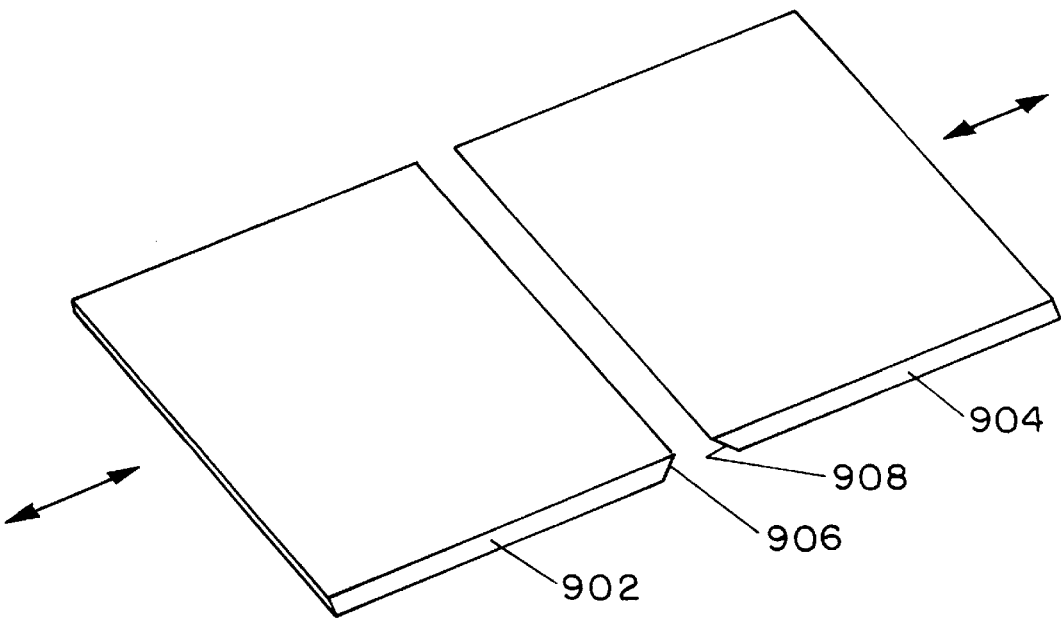

FIG. 9 illustrates an alternate embodiment for the aperture member 110. In this embodiment, a one dimensional aperture can be defined by a first member 902 and a second member 904 which are in substantially parallel alignment. The first member 902 and second member 904 can be formed as plates of sheet material or bar material. Preferably, the first member 902 and the second member 904 are operatively coupled to a drive mechanism (not shown) under the control of CPU 204 to adjust the relative spacing of the first and second member, thereby altering the width of the aperture defined there between. To tailor the vertical profile of the resulting deposit material the adjacent edges of the first member 902 and the second member 904, respectively, can be contoured, such as by providing a camfer to the surfaces 906, 908. In this form of aperture, the aperture members 902, 904 will preferably be formed with a non-stick surface to reduce buildup of the spray material and will be subject to periodic cleaning.

A two-dimensional aperture system substantially in accordance with FIG. 9, which forms a dynamic rectangular opening can be formed by placing two additional aperture members and associated drive mechanisms in an orthogonal, overlapping relationship with the first member 902 and second member 904.

The present systems and methods provide for the generation of fine features, such a lines having a width of 20–200 microns, on a substrate without the use of a mask in contact with the surface of the substrate. In addition, the aperture can be opened to allow larger area patches or blanket deposits with precise geometries to be formed. Because no masks are involved, multilayer structures can be formed quickly and efficiently by depositing layers of various materials in sequence without requiring a reduction step of removing the mask between subsequent operations. Multilayer electrical circuits and sensors can be formed by depositing features using conductive materials, resistive materials, dielectric materials insulative materials and the like.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A system for fine feature spray deposition comprising:
   a substrate platform for supporting a substrate;
   a spray assembly comprising:
      a spray source for providing a stream of material to be deposited on a substrate; and
      a dynamic aperture assembly, said dynamic aperture assembly being positioned downstream of said spray source and above said substrate platform, the dynamic aperture assembly defining at least one opening therein to pass at least a portion of the stream of material onto a surface of the substrate;
   a drive mechanism, the drive mechanism being operatively coupled to at least one of the spray assembly and the substrate platform for inducing relative motion there between; and
   a controller, the controller being operably coupled to said spray assembly and said drive mechanism to control said relative motion and said stream of material.

2. The system for fine feature spray deposition of claim 1, wherein the dynamic aperture assembly comprises:
   a supply reel;
   an elongate strip of flexible aperture material having at least one opening defined therein and engaged on the supply reel;
   a take-up reel for receiving the aperture material, said supply reel and said take-up reel being positioned to extend at least a portion of the aperture material over the substrate platform; and
   a rotational drive assembly operatively coupled to at least one of the supply reel and the take-up reel to advance the aperture material with respect to the substrate platform.

3. The system for fine feature spray deposition of claim 2, wherein the aperture material has a plurality of openings arranged in repeating patterns along the length of the aperture material.

4. The system for fine feature spray deposition of claim 1, wherein the dynamic aperture assembly comprises:
   a supply reel having a first supply reel portion and a second supply reel portion, said first and second supply reel portions being mutually axially aligned and axially displaceable;
   a first elongate strip of flexible aperture material engaged on the first supply reel portion;
   a second elongate strip of flexible aperture material engaged on the second supply reel portion;
   a take-up reel for receiving the aperture material, said take-up reel having a first take-up reel portion and a second take-up reel portion, said first and second take-up reel portions being mutually axially aligned and axially displaceable; said supply reel and said take-up reel being positioned to extend at least a portion of the first elongate strip of flexible aperture material and the second elongate strip of flexible aperture material over the substrate platform in a substantially parallel relationship;
   a rotational drive assembly operatively coupled to at least one of the supply reel and the take-up reel to advance the aperture material with respect to the substrate platform; and
   a displacement drive assembly operatively coupled to the supply reel and the take-up reel to control a spacing and the substantially parallel relationship of the first elongate strip of flexible aperture material and the second elongate strip of flexible aperture material.

5. The system for fine feature spray deposition of claim 1, wherein the dynamic aperture assembly comprises a first aperture sub-assembly and a second aperture sub-assembly, the first and second aperture sub-assemblies being substantially orthogonally aligned over the substrate platform, each of said first and second aperture sub-assemblies comprising:
   a supply reel having a first supply reel portion and a second supply reel portion, said first and second supply reel portions being mutually axially aligned and axially displaceable;
   a first elongate strip of flexible aperture material engaged on the first supply reel portion;
   a second elongate strip of flexible aperture material engaged on the second supply reel portion;
   a take-up reel for receiving the aperture material, said take-up reel having a first take-up reel portion and a second take-up reel portion, said first and second take-up reel portions being mutually axially aligned and axially displaceable; said supply reel and said take-up reel being positioned to extend at least a portion of the first elongate strip of flexible aperture material and the second elongate strip of flexible aperture material over the substrate platform in a substantially parallel relationship;
   a rotational drive assembly operatively coupled to at least one of the supply reel and the take-up reel to advance the aperture material with respect to the substrate platform; and
   a displacement drive assembly operatively coupled to the supply reel and the take-up reel to control a spacing and the substantially parallel relationship of the first elongate strip of flexible aperture material and the second elongate strip of flexible aperture material.

6. The system for fine feature spray deposition of claim 1, wherein the drive mechanism further comprises an x-y drive table coupled to the substrate platform.

7. The system for fine feature spray deposition of claim 1, wherein the drive mechanism further comprises a robotic arm operable in the x, y and z directions, the robotic arm being coupled to the spray assembly.

8. The system for fine feature spray deposition of claim 1, wherein the drive mechanism further comprises a robotic arm operable in the x, y and z directions, the robotic arm being coupled to the substrate platform.

9. The system for fine feature spray deposition of claim 1, wherein the spray source is selected from the group consisting of a combustion spray torch, a plasma spray torch, a detonation gun, high velocity oxygen fuel torch, and spray torch, and a cold spray gun.

10. The system for fine feature spray deposition of claim 1, further comprising a CAD interface operatively coupled to the controller.

11. The system for fine feature spray deposition of claim 1, wherein said dynamic aperture assembly further comprises an aperture cutting device, said aperture cutting device being operatively coupled to said controller for forming said at least one opening in the dynamic aperture assembly.

12. The system for fine feature spray deposition of claim 11, wherein the aperture cutting device includes a laser having a changeable focal length to alter the size of said at least one opening.

13. A system for fine feature spray deposition comprising:
  a substrate platform for supporting a substrate;
  spray assembly comprising:
    a spray source for providing a stream of material to be deposited on a substrate;
    a collimator, said collimator being positioned in a path of the stream from said spray source; and
    a dynamic aperture assembly, said dynamic aperture assembly being positioned downstream of said collimator with respect to said spray source and above said substrate platform, the dynamic aperture assembly defining at least one opening therein to pass at least a portion of the stream of material onto a surface of the substrate;
  a drive mechanism, the drive mechanism being operatively coupled to at least one of the spray assembly and the substrate platform for inducing relative motion there between; and
  a controller, the controller being operably coupled to said spray assembly and said drive mechanism to control said relative motion and said stream of material.

14. The system for fine feature spray deposition of claim 13, wherein the collimator comprises a first wall section and a second wall section, the first and second wall sections converging in a V-shaped arrangement and defining an opening at an apex of the V-shaped arrangement.

15. The system for fine feature spray deposition of claim 13, wherein the collimator comprises first and second collimator members in a spaced relationship.

16. The system for fine feature spray deposition of claim 15, wherein the first collimator member comprises a first wall section and a second wall section, the first and second wall sections converging in a V-shaped arrangement and defining an opening at an apex of the V-shaped arrangement.

17. The system for fine feature spray deposition of claim 15, wherein the second collimator member comprises a frustoconical member having an opening in substantial alignment with at least a portion of the opening in said first collimator member.

18. The system for fine feature spray deposition of claim 13, wherein the dynamic aperture assembly comprises:
  a supply reel;
  an elongate strip of flexible aperture material -having at least one opening defined therein and engaged on the supply reel;
  a take-up reel for receiving the aperture material, said supply reel and said take-up reel being positioned to extend at least a portion of the aperture material over the substrate platform; and
  a rotational drive assembly operatively coupled to at least one of the supply reel and the take-up reel to advance the aperture material with respect to the substrate platform.

19. The system for fine feature spray deposition of claim 18, wherein the aperture material has a plurality of openings arranged in repeating patterns along the length of the aperture material.

20. The system for fine feature spray deposition of claim 13, wherein the dynamic aperture assembly comprises:
  a supply reel having a first supply reel portion and a second supply reel portion, said first and second supply reel portions being mutually axially aligned and axially displaceable;
  a first elongate strip of flexible aperture material engaged on the first supply reel portion;
  a second elongate strip of flexible aperture material engaged on the second supply reel portion;
  a take-up reel for receiving the aperture material, said take-up reel having a first take-up reel portion and a second take-up reel portion, said first and second take-up reel portions being mutually axially aligned and axially displaceable; said supply reel and said take-up reel being positioned to extend at least a portion of the first elongate strip of flexible aperture material and the second elongate strip of flexible aperture material over the substrate platform in a substantially parallel relationship;
  a rotational drive assembly operatively coupled to at least one of the supply reel and the take-up reel to advance the aperture material with respect to the substrate platform; and
  a displacement drive assembly operatively coupled to the supply reel and the take-up reel to control a spacing and the substantially parallel relationship of the first elongate strip of flexible aperture material and the second elongate strip of flexible aperture material.

21. The system for fine feature spray deposition of claim 13, wherein the dynamic aperture assembly comprises a first aperture sub-assembly and a second aperture sub-assembly, the first and second aperture sub-assemblies being substantially orthogonally aligned over the substrate platform, each of said first and second aperture sub-assemblies comprising:
  a supply reel having a first supply reel portion and a second supply reel portion, said first and second supply reel portions being mutually axially aligned and axially displaceable;
  a first elongate strip of flexible aperture material engaged on the first supply reel portion;
  a second elongate strip of flexible aperture material engaged on the second supply reel portion;
  a take-up reel for receiving the aperture material, said take-up reel having a first take-up reel portion and a second take-up reel portion, said first and second take-up reel portions being mutually axially aligned and axially displaceable; said supply reel and said take-up reel being positioned to extend at least a portion of the first elongate strip of flexible aperture material and the second elongate strip of flexible aperture material over the substrate platform in a substantially parallel relationship;
  a rotational drive assembly operatively coupled to at least one of the supply reel and the take-up reel to advance the aperture material with respect to the substrate platform; and a displacement drive assembly operatively coupled to the supply reel and the take-up reel to control a spacing and the substantially parallel relationship of the first elongate strip of flexible aperture material and the second elongate strip of flexible aperture material.

22. The system for fine feature spray deposition of claim 13, wherein the drive mechanism further comprises an x-y drive table coupled to the substrate platform.

23. The system for fine feature spray deposition of claim 13, wherein the drive mechanism further comprises a robotic arm operable in the x, y and z directions, the robotic arm being coupled to the spray assembly.

24. The system for fine feature spray deposition of claim 13, wherein the drive mechanism further comprises a robotic arm operable in the x, y and z directions, the robotic arm being coupled to the substrate platform.

25. The system for fine feature spray deposition of claim 13, wherein the spray source is selected from the group consisting of a combustion spray torch, a plasma spray torch, a detonation gun, high velocity oxygen fuel torch, and spray torch, electric arc-spray and a cold spray gun.

26. The system for fine feature spray deposition of claim 13, further comprising a CAD interface operatively coupled to the controller.

27. The system for fine feature spray deposition of claim 13, wherein said dynamic aperture assembly further comprises an aperture cutting device, said aperture cutting device being operatively coupled to said controller for forming said at least one opening in the dynamic aperture assembly.

28. The system for fine feature spray deposition of claim 27, wherein the aperture cutting device includes a laser having a changeable focal length to alter the size of said at least one opening.

29. A method for depositing a fine feature on a substrate using spray deposition comprising:

generating a stream of material from a spray source;

passing a portion of the stream through a collimator spaced from the spray source;

passing the portion of the stream through an opening in a dynamic aperture member spaced from the collimator and supported above the surface of the substrate;

moving one of the substrate or dynamic aperture member while generating the stream of material from the spray source to define the feature on the surface of the substrate.

30. The method for depositing a fine feature on a substrate according to claim 29, further comprising varying the size of the opening in the dynamic aperture member in accordance with the geometry of the feature to be formed.

31. The method for depositing a fine feature on a substrate according to claim 30, wherein the dynamic aperture member is formed with a first pair of members arranged in a first direction and a second pair of members arranged in a second direction intersecting the first pair of members over the substrate to define the opening, wherein the operation of varying the size of the opening is effected by changing a spacing in at least one of the first pair of members or second pair of members.

32. The method for depositing a fine feature on a substrate according to claim 31, wherein the first pair of members are substantially parallel to one another, the second pair of members are substantially parallel to one another, and the second direction is substantially orthogonal to the first direction.

33. The method for depositing a fine feature on a substrate according to claim 32, wherein the step of moving one of the substrate or dynamic aperture member includes at least one of moving at first pair of members along the second direction and the second pair of members along the first direction.

34. The method for depositing a fine feature on a substrate according to claim 33, further comprising generating the opening in the dynamic aperture member using an aperture cutting station and advancing the dynamic aperture member over the surface of the substrate.

35. The method for depositing a fine feature on a substrate according to claim 29, wherein after the feature is formed, the method further comprises:

generating a stream of a second material from a second spray source;

passing a portion of the second stream through a collimator spaced from the second spray source;

passing the portion of the second stream through an opening in a dynamic aperture member spaced from the collimator and supported above the surface of the substrate;

moving one of the substrate or dynamic aperture member to define a second feature on the surface of the substrate.

36. The method for depositing a fine feature on a substrate according to claim 35, wherein the first material has electrical properties which are one of conductive, resistive, magnetic, capacitive or insulative and the second material is selected to have electrical properties different from said first material.

37. A method for directly printing a multilayer electrical component on a substrate comprising:

generating a stream of conductive material from a spray source;

passing a portion of the stream through a collimator spaced from the spray source;

passing the portion of the stream through an opening in a dynamic aperture member spaced from the collimator and supported above the surface of the substrate;

moving one of the substrate or dynamic aperture member to define a first conductive feature on the surface of the substrate;

generating a stream of an insulative material from a second spray source;

passing a portion of the stream through a collimator spaced from the second spray source;

passing the portion of the stream through an opening in a dynamic aperture member spaced from the collimator and supported above the surface of the substrate; and moving one of the substrate or dynamic aperture member to define an insulative feature on the surface of the substrate at least partially covering the first conductive feature.

38. The method for directly printing a multilayer electrical component on a substrate according to claim 37, further comprising varying the size of the opening in the dynamic aperture member in accordance with the geometry of the conductive feature or insulative feature to be formed.

39. The method for directly printing a multilayer electrical component on a substrate according to claim 38, wherein the dynamic aperture member is formed with a first pair of members arranged in a first direction and a second pair of members arranged in a second direction intersecting the first pair of members over the substrate to define the opening, wherein the operation of varying the size of the opening is effected by changing a spacing in at least one of the first pair of members or second pair of members.

40. The method for directly printing a multilayer electrical component on a substrate according to claim 39, wherein the first pair of members are substantially parallel to one another, the second pair of members are substantially parallel to one another, and the second direction is substantially orthogonal to the first direction.

41. The method for directly printing a multilayer electrical component on a substrate according to claim 40, wherein the step of moving one of the substrate or dynamic aperture member includes at least one of moving the first pair of members along the second direction and the second pair of members along the first direction.

42. The method for directly printing a multilayer electrical component on a substrate according to claim 41, further comprising generating the opening in the dynamic aperture member using an aperture cutting station and advancing the dynamic aperture member over the surface of the substrate.

43. The method for directly printing a multilayer electrical component on a substrate according to claim 37, further comprising:

generating a stream of resistive material from a spray source;

passing a portion of the stream of resistive material through a collimator spaced from the spray source;

passing the portion of the stream of resistive material through an opening in a dynamic aperture member spaced from the collimator and supported above the surface of the substrate;

moving one of the substrate or dynamic aperture member to define a first resistive feature on the surface of the substrate.

44. The method for directly printing a multilayer electrical component on a substrate according to claim 37, further comprising:

generating a stream of dielectric material from a spray source;

passing a portion of the stream of dielectric material through a collimator spaced from the spray source;

passing the portion of the stream of dielectric material through an opening in a dynamic aperture member spaced from the collimator and supported above the surface of the substrate;

moving one of the substrate or dynamic aperture member to define a first dielectric feature on the surface of the substrate.

45. The method for directly printing a multilayer electrical component on a substrate according to claim 37, further comprising:

generating a stream of magnetic material from a spray source;

passing a portion of the stream of magnetic material through a collimator spaced from the spray source;

passing the portion of the stream of magnetic material through an opening in a dynamic aperture member spaced from the collimator and supported above the surface of the substrate;

moving one of the substrate or dynamic aperture member to define a first magnetic feature on the surface of the substrate.

* * * * *

UNITED STATES PATENT AND TRADEMARK OFFICE
CERTIFICATE OF CORRECTION

PATENT NO. : 6,576,861 B2
DATED : June 10, 2003
INVENTOR(S) : Sampath et al.

It is certified that error appears in the above-identified patent and that said Letters Patent is hereby corrected as shown below:

Title page,
Item [57], ABSTRACT,
Line 13, "there" should read -- there- --

Column 2,
Line 24, "there" should read -- there- --
Line 31, "apperture" should read -- aperture --

Column 3,
Line 44, "cross sectional" should read -- cross-sectional --
Line 60, "continuos" should read -- continuous --
Line 62, "to" should read -- of --

Column 4,
Line 5, "there between;" should read -- therebetween; --
Line 9, "assembly:" should read -- assembly. --
Line 23, "cross sectional" should read -- cross-sectional --

Column 7,
Line 66, "Nitrogen," should read -- nitrogen, --; and "Carbon" should read -- carbon --
Line 67, "Dioxide" should read -- dioxide --

Column 8,
Line 5, "CO2" should read -- $CO_2$ --
Line 8, "one dimensional" should read -- one-dimensional --
Lines 10 and 66, "slot shaped" should read -- slot-shaped --
Line 44, "and or" should read -- and/or --
Line 64, "there through." should read -- therethrough. --

Column 10,
Line 51, "one dimensional" should read -- one-dimensional --
Line 60, "there between." should read -- therebetween. --
Line 63, "camfer" should read -- chamfer --

Column 11,
Line 39, "there between;" should read -- therebetween; --

UNITED STATES PATENT AND TRADEMARK OFFICE
CERTIFICATE OF CORRECTION

PATENT NO.    : 6,576,861 B2
DATED         : June 10, 2003
INVENTOR(S)   : Sampath et al.

It is certified that error appears in the above-identified patent and that said Letters Patent is hereby corrected as shown below:

Column 13,
Line 5, "and" should read -- a --
Line 22, "spray" should read -- a spray --
Line 37, "there between" should read -- therebetween --
Line 62, "-having" should read -- having --

Column 15,
Line 21, "and" should read -- a --
Line 22, "electric arc-spray" should read -- an electric arc-spray --
Line 44, "substrate;" should read -- substrate; and --

Column 16,
Line 4, "at" should read -- the --
Line 21, "substrate;" should read -- substrate; and --

Column 17,
Line 30, "substrate;" should read -- substrate; and --

Column 18,
Lines 13 and 28, "substrate;" should read -- substrate; and --

Signed and Sealed this

Eleventh Day of November, 2003

JAMES E. ROGAN
*Director of the United States Patent and Trademark Office*